US009799562B2

(12) United States Patent
Kirby et al.

(10) Patent No.: US 9,799,562 B2
(45) Date of Patent: Oct. 24, 2017

(54) VIAS AND CONDUCTIVE ROUTING LAYERS IN SEMICONDUCTOR SUBSTRATES

(75) Inventors: Kyle K. Kirby, Eagle, ID (US); Sarah A. Niroumand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 77 days.

(21) Appl. No.: 12/545,196

(22) Filed: Aug. 21, 2009

(65) Prior Publication Data
US 2011/0042821 A1 Feb. 24, 2011

(51) Int. Cl.
| | |
|---|---|
| *H01L 21/48* | (2006.01) |
| *H01L 21/768* | (2006.01) |
| *H01L 23/48* | (2006.01) |
| *H01L 23/00* | (2006.01) |

(52) U.S. Cl.
CPC ...... *H01L 21/76898* (2013.01); *H01L 23/481* (2013.01); *H01L 24/16* (2013.01); *H01L 2224/0401* (2013.01); *H01L 2224/05025* (2013.01); *H01L 2224/13025* (2013.01); *H01L 2924/01078* (2013.01); *H01L 2924/01079* (2013.01); *H01L 2924/09701* (2013.01);
(Continued)

(58) Field of Classification Search
CPC ............. H01L 21/76898; H01L 23/481; H01L 2924/14; H01L 2924/12042; H01L 2224/0401; H01L 2224/05025; H01L 24/16; H01L 2924/01079; H01L 2924/09701; H01L 2924/3025; H01L 2224/13025; H01L 2924/01078
See application file for complete search history.

(56) References Cited

U.S. PATENT DOCUMENTS 5,173,442 A * 12/1992 Carey .......................... 216/18
6,107,186 A 8/2000 Erb
6,221,769 B1 4/2001 Dhong et al.
(Continued)

FOREIGN PATENT DOCUMENTS

KR 20050073372 A 7/2005
TW 200539244 A 12/2005
(Continued)

OTHER PUBLICATIONS

International Search Report and Written Opinion issued Mar. 17, 2011 in International Application No. PCT/US2010/043563, 10 pages.
(Continued)

*Primary Examiner* — Julio J Maldonado
*Assistant Examiner* — Stanetta Isaac
(74) *Attorney, Agent, or Firm* — Perkins Coie LLP

(57) ABSTRACT

Through vias and conductive routing layers in semiconductor substrates and associated methods of manufacturing are disclosed herein. In one embodiment, a method for processing a semiconductor substrate includes forming an aperture in a semiconductor substrate and through a dielectric on the semiconductor substrate. The aperture has a first end open at the dielectric and a second end opposite the first end. The method can also include forming a plurality of depressions in the dielectric, and simultaneously depositing a conductive material into the aperture and at least some of the depressions.

22 Claims, 7 Drawing Sheets

(52) U.S. Cl.
CPC ..... *H01L 2924/12042* (2013.01); *H01L 2924/14* (2013.01); *H01L 2924/3025* (2013.01)

(56) References Cited

U.S. PATENT DOCUMENTS

| | | | |
|---|---|---|---|
| 6,444,576 B1 * | 9/2002 | Kong | ............... H01L 25/0657 257/686 |
| 6,455,425 B1 | 9/2002 | Besser et al. | |
| 6,582,992 B2 | 6/2003 | Poo et al. | |
| 6,903,443 B2 | 6/2005 | Farnworth et al. | |
| 6,962,867 B2 | 11/2005 | Jackson et al. | |
| 7,091,124 B2 | 8/2006 | Rigg et al. | |
| 7,111,149 B2 | 9/2006 | Eilert | |
| 7,317,256 B2 | 1/2008 | Williams et al. | |
| 7,449,098 B1 | 11/2008 | Mayer et al. | |
| 7,745,931 B2 | 6/2010 | Takao | |
| 2002/0064729 A1 | 5/2002 | Ching et al. | |
| 2003/0113967 A1 | 6/2003 | Allman et al. | |
| 2003/0234416 A1 | 12/2003 | Thomas et al. | |
| 2004/0048459 A1 * | 3/2004 | Patti | ........................ 438/612 |
| 2004/0121521 A1 | 6/2004 | Jackson et al. | |
| 2005/0001326 A1 | 1/2005 | Masuda | |
| 2005/0009333 A1 | 1/2005 | Lee et al. | |
| 2005/0029630 A1 * | 2/2005 | Matsuo | ........................ 257/628 |
| 2006/0019467 A1 * | 1/2006 | Lee et al. | ...................... 438/462 |
| 2006/0043599 A1 * | 3/2006 | Akram | ............... H01L 21/6835 257/774 |
| 2006/0046461 A1 * | 3/2006 | Benson et al. | ................ 438/612 |
| 2006/0246699 A1 * | 11/2006 | Weidman et al. | ............ 438/597 |
| 2006/0258111 A1 | 11/2006 | Jagueneau et al. | |
| 2006/0270196 A1 * | 11/2006 | Kirby | ............................ 438/462 |
| 2007/0048896 A1 | 3/2007 | Andry et al. | |
| 2007/0063240 A1 | 3/2007 | Torres et al. | |
| 2007/0178694 A1 * | 8/2007 | Hiatt | ........................... 438/667 |
| 2007/0190692 A1 | 8/2007 | Erturk et al. | |
| 2008/0164573 A1 | 7/2008 | Basker et al. | |
| 2008/0299759 A1 | 12/2008 | Chatterjee et al. | |
| 2008/0299762 A1 | 12/2008 | Mathew et al. | |
| 2008/0318361 A1 | 12/2008 | Han et al. | |
| 2009/0008790 A1 * | 1/2009 | Lee | ...................... H01L 23/481 257/774 |
| 2009/0051039 A1 | 2/2009 | Kuo et al. | |
| 2009/0091962 A1 | 4/2009 | Chung et al. | |
| 2009/0124072 A1 | 5/2009 | Park et al. | |
| 2009/0127668 A1 | 5/2009 | Choi | |
| 2009/0152602 A1 | 6/2009 | Akiyama | |
| 2009/0180257 A1 | 7/2009 | Park et al. | |
| 2009/0206488 A1 | 8/2009 | Lindgren et al. | |
| 2009/0224405 A1 | 9/2009 | Chiou et al. | |
| 2009/0239375 A1 * | 9/2009 | Riess et al. | ................... 438/640 |
| 2009/0278237 A1 * | 11/2009 | Cooney et al. | ............... 257/621 |
| 2009/0315154 A1 | 12/2009 | Kirby et al. | |
| 2011/0068477 A1 | 3/2011 | Stamper et al. | |

FOREIGN PATENT DOCUMENTS

| | | |
|---|---|---|
| TW | I245379 B | 12/2005 |
| TW | 200821636 A | 5/2008 |
| TW | 201010026 A | 3/2010 |

OTHER PUBLICATIONS

Kurita, Y. et al., A 3D Stacked Memory Integrated on a Logic Device Using SMAFTI Technology, 2007 IEEE Electronic Components and Technology Conference, pp. 821-829, May 29-Jun. 1, 2007, ISBN 1-4244-0985-3.
U.S. Appl. No. 12/701,800, filed Feb. 8, 2010, to Kirby et al.
Office Action issued Jun. 28, 2013 in Korea Application No. 10-2012-7007184, 15 pages.
Office Action issued Apr. 23, 2013 in Taiwan Application No. 099126998, 21 pages.
Office Action issued Sep. 3, 2013 in China Application No. 201080037290.7, 17 pages.
Office Action issued May 15, 2014 in Taiwan Application No. 099126998, 15 pages.
Office Action issued May 26, 2014 in Chinese Application No. 201080037290.7, 13 pages.
Office Action mailed Oct. 9, 2015, in China Patent Application No. 201080037290.7, 8 pages.
Office Action mailed Oct. 7, 2015, in Taiwan Patent Application No. 099126998, 17 pages.
Office Action mailed Feb. 5, 2015 in China App. No. 201080037290.7, 21 pages.
Office Action mailed Mar. 10, 2015 in Taiwan App. No. 099126998, 15 pages.
Office Action mailed Jun. 22, 2016 in China Application No. 201080037290.7, 10 pages.

* cited by examiner

US 9,799,562 B2

VIAS AND CONDUCTIVE ROUTING LAYERS IN SEMICONDUCTOR SUBSTRATES

TECHNICAL FIELD

The present disclosure is directed generally to vias and conductive routing layers in semiconductor substrates, and associated systems and devices.

BACKGROUND

Packaged semiconductor dies, including memory chips, microprocessor chips, and imager chips, typically include a semiconductor die mounted to a substrate and encased in a plastic protective covering. The die includes functional features, such as memory cells, processor circuits, imager devices, and interconnecting circuitry. The die also typically includes bond pads electrically coupled to the functional features. The bond pads are electrically connected to pins or other types of terminals that extend outside the protective covering for connecting to busses, circuits, and/or other microelectronic assemblies.

Market pressures continually drive manufacturers to reduce the size of semiconductor die packages and to increase the functional capacity of such packages. One approach for achieving these results is to stack multiple semiconductor dies in a single package. In such packages, the stacked dies can be electrically coupled together using conductive vias that extend through the entire thickness of the dies. The conductive vias are generally referred to as through silicon vias or TSV.

Conventional processes for forming TSVs include patterning a semiconductor substrate, etching the semiconductor substrate to create an aperture, and plating the aperture with a conductive material. Plating the aperture can include either pattern plating with a resist mask or blanket plating without a resist mask. Both plating techniques have certain drawbacks. For example, in addition to the other TSV processes, pattern plating includes forming a resist layer, patterning the resist layer, and removing the resist layer after plating, and/or other additional processing stages. On the other hand, even though blanket plating does not require as many steps as pattern plating, blanket plating creates a large amount of excess conductive material on the surface of semiconductor substrate. The excess conductive material must be removed before subsequent processing stages, which takes time and wastes the conductive material. As a result, there remains a need for improved techniques for forming TSVs in semiconductor substrates.

DETAILED DESCRIPTION

Several embodiments of the present technology are described below with reference to processes for forming through vias and conductive routing layers in semiconductor substrates. Many details of certain embodiments are described below with reference to semiconductor dies. The term "semiconductor substrate" is used throughout to include a variety of articles of manufacture, including, for example, individual integrated circuit dies, imager dies, sensor dies, and/or dies having other semiconductor features. Several of the processes described below may be used to form through vias and conductive routing layers in an individual die, or in a plurality of dies, on a wafer or portion of a wafer. The wafer or wafer portion (e.g., wafer form) can include an unsingulated wafer or wafer portion, or a repopulated carrier wafer. The repopulated carrier wafer can include an adhesive material (e.g., a flexible adhesive) surrounded by a generally rigid frame having a perimeter shape comparable to that of an unsingulated wafer, and singulated elements (e.g., dies) surrounded by the adhesive.

Many specific details of certain embodiments are set forth in FIGS. 1A-3 and the following text to provide a thorough understanding of these embodiments. Several other embodiments can have configurations, components, and/or processes different than those described in this disclosure. A person skilled in the relevant art, therefore, will appreciate that additional embodiments may be practiced without several of the details of the embodiments shown in FIGS. 1A-3.

Figure 1A:
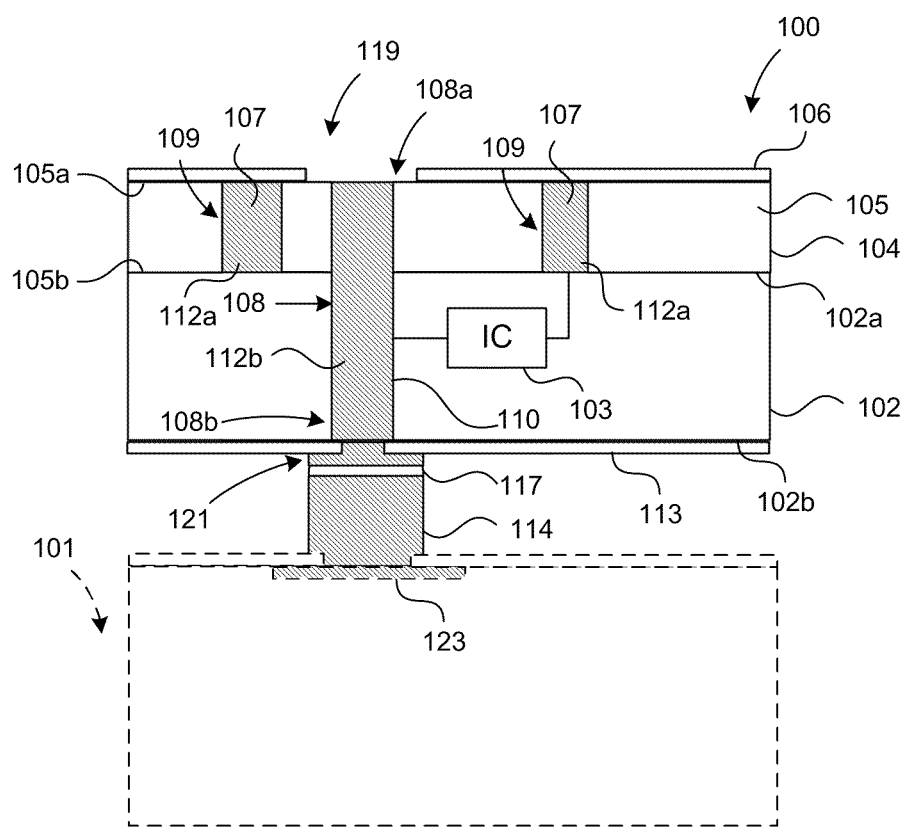
FIGS. 1A-1D are schematic side cross-sectional views of a portion of a semiconductor die in accordance with embodiments of the technology.

FIG. 1A is a schematic side cross-sectional view of a portion of a semiconductor die 100 processed in accordance with embodiments of the technology. As shown in FIG. 1A, the semiconductor die 100 can include a substrate 102 and a routing structure 104. In the illustrated embodiment, the semiconductor die 100 also includes an optional first passivation material 106 on top of the routing structure 104 and an optional second passivation material 113 on the bottom of the substrate 102. The first and second passivation materials 106 and 113 can include silicon oxide, silicon nitride, and/or other suitable dielectric material. In other embodiments, the first and/or second passivation materials 106 and 113 may be omitted.

The substrate 102 has a first substrate surface 102a and a second substrate surface 102b. The substrate 102 can include doped or undoped silicon, TEOS, glass, ceramics, and/or other suitable material. The routing structure 104 can include a dielectric 105 with a first dielectric surface 105a and a second dielectric surface 105b. The first dielectric surface 105a is proximate the optional first passivation material 106, and the second dielectric surface 105b is proximate the first substrate surface 102a of the substrate 102.

The routing structure 104 can also include at least one electrically conductive trace 107 (two traces 107 are shown for illustration purposes) in the dielectric 105. The dielectric 105, for example, can include one or more depressions 109, and the traces 107 can include a first conductive material portion 112a that at least partially fills the depressions 109. In the illustrated embodiment, the individual depressions 109 have a generally rectangular cross-sectional area extending from the first dielectric surface 105a to the second dielectric surface 105b. In other embodiments, the depressions 109 can have oval, scalloped, and/or other cross-sectional areas that extend from the first dielectric surface 105a to an intermediate depth (not shown) in the dielectric 105. Even though only one routing structure 104 is shown in FIG. 1A, in other embodiments, the semiconductor die 100 can also include two, three, or any other desired number of routing structures and conductive vias (not shown) electrically coupling at least some of the conductive routing structures.

The semiconductor die 100 can also include an integrated circuit 103 electrically coupled to at least one conductive through via 108 that extends through the dielectric 105 and the substrate 102. The integrated circuit 103 can include a processor circuit, a RAM circuit, an ASIC circuit, and/or other suitable circuits. The through via 108 can include a second conductive material portion 112b at least partially filling an aperture 110 in the semiconductor die 100. In the illustrated embodiment, the aperture 110 extends from the first dielectric surface 105a of the dielectric 105 to the second substrate surface 102b of the substrate 102. In other embodiments, the aperture 110 can also extend from other locations in the dielectric 105 to the second substrate surface 102b of the substrate 102. In further embodiments, the aperture 110 can be entirely contained in the substrate 102.

As shown in FIG. 1A, the through via 108 has a first end 108a open to the first dielectric surface 105a and a second end 108b proximate the second substrate surface 102b of the substrate 102. In certain embodiments, the first end 108a can form a first bond site 119 through an opening in the optional first passivation material 106, and the second end 108b can form a second bond site 121 through an opening in the optional second passivation material 113. The first and second bond sites 119 and 121 may be configured to interconnect with other dies, substrates, and/or external devices (not shown) with an interconnect component 114. In the illustrated embodiment, the interconnect component 114 includes a conductive pillar (e.g., a copper pillar) proximate to a wetting material 117 (e.g., a solder material). The interconnect component 114 connects the second end 108b of the semiconductor die 100 to a bond site 123 of another semiconductor die 101 (shown in phantom lines for clarity). The semiconductor die 101 may be structurally and/or functionally similar to or different from the semiconductor die 100. In other embodiments, the interconnect component 114 can also include a solder ball, a redistribution layer, a through silicon via stud, and/or other suitable interconnect devices components.

One feature of several embodiments of the semiconductor die 100 is that the first conductive material portion 112a of the traces 107 and the second conductive material portion 112b of the through via 108 (collectively referred to as the conductive material 112) can be formed simultaneously without intervening processing stages. As a result, the first and second conductive material portions 112a and 112b can be generally homogeneous. The homogeneity nature of the conductive material 112 is believed to enhance the reliability of the traces 107 and the through via 108, and therefore the semiconductor die 100, because the first and second conductive material portions 112a and 112b may be subsequently processed together (e.g., in an annealing stage). Several embodiments of the semiconductor die 100 can also have reduced manufacturing costs when compared to conventional processes because certain processing stages may be eliminated, as described in more detail below with reference to FIGS. 2A-3D.

Figure 1B:
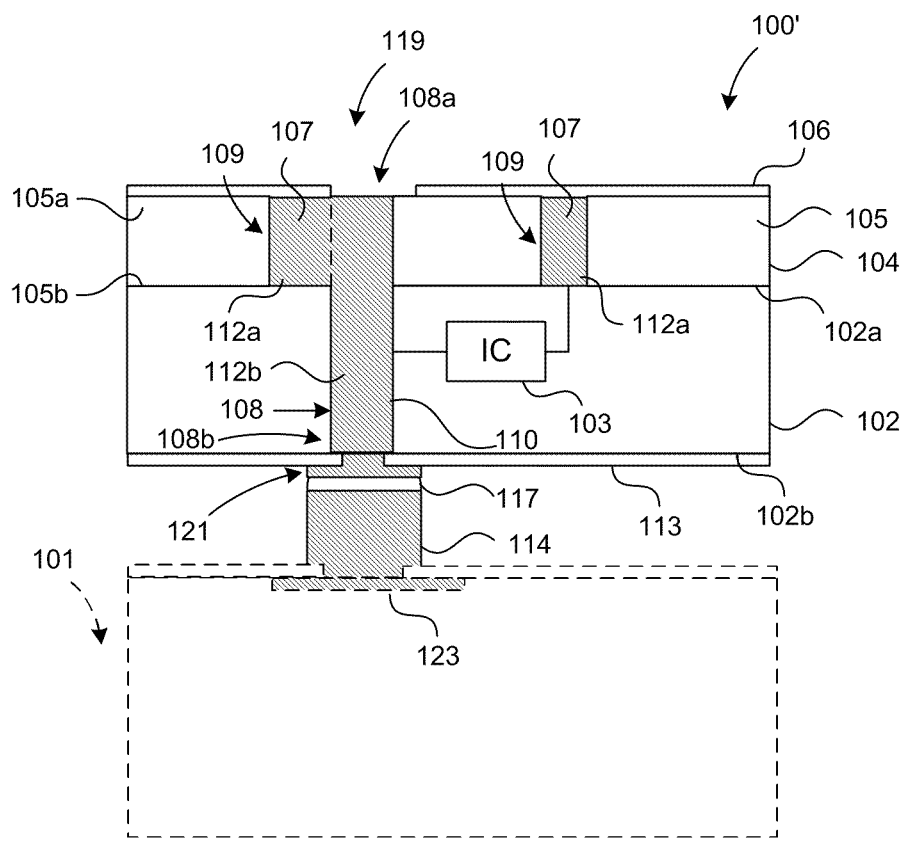
Figure 1C:
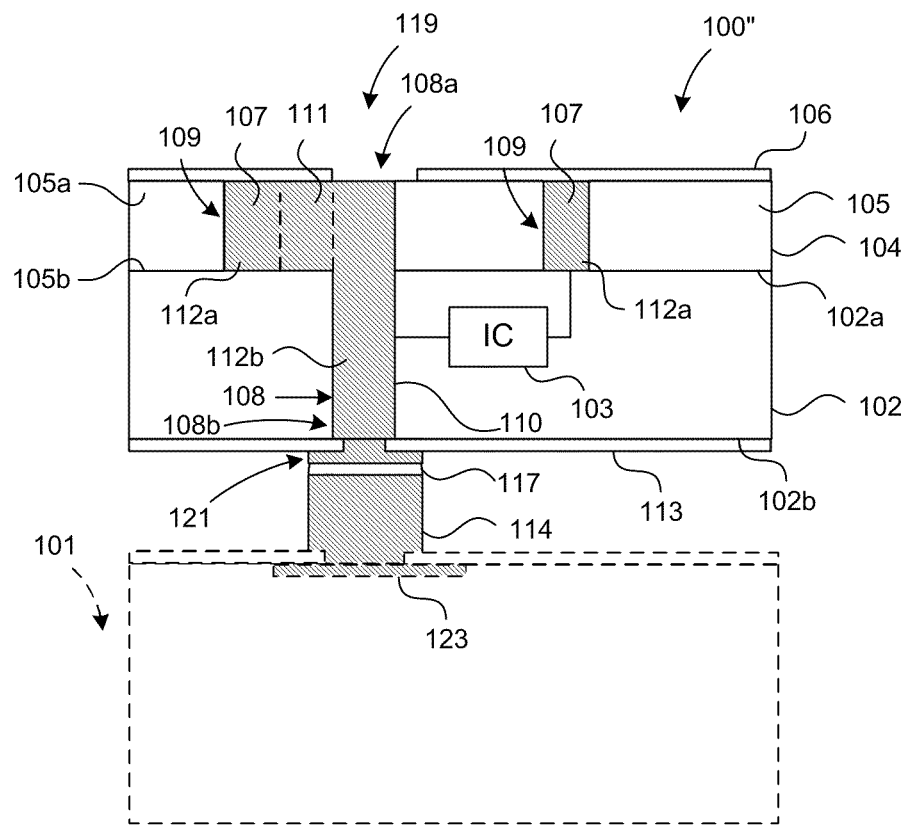
Figure 1D:
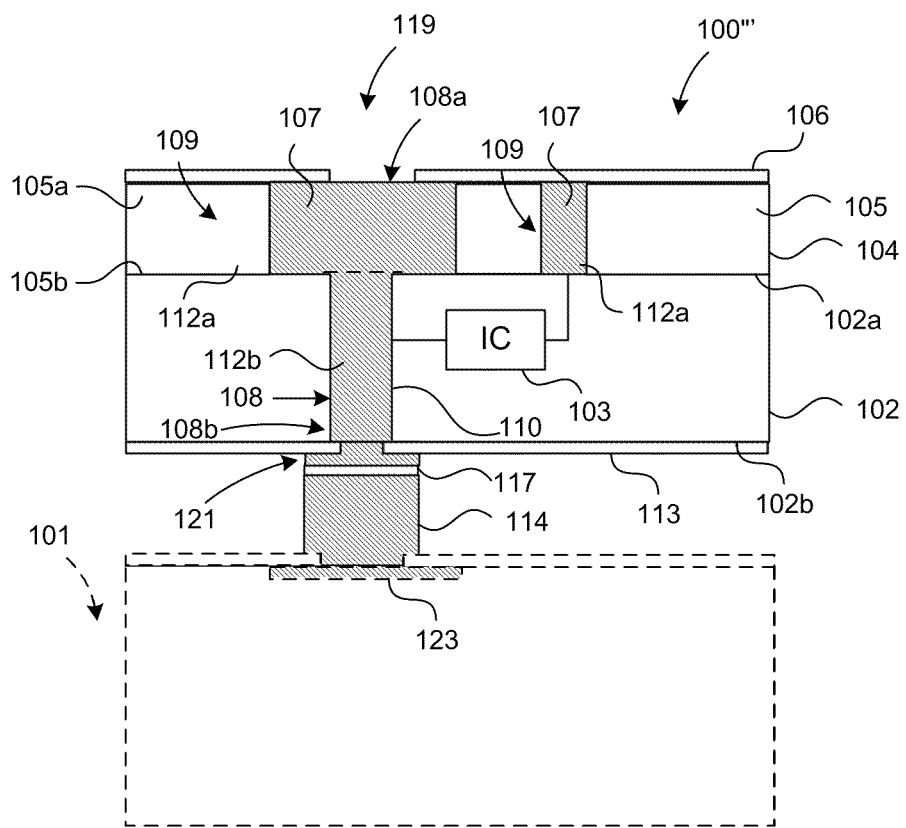

Even though the traces 107 and the through via 108 are isolated from each other in FIG. 1A, FIG. 1B shows another embodiment in which at least one of the traces 107 may be in contact with the through via 108. In other embodiments, the routing structure 104 may optionally include a conductive wire, trace, and/or another suitable interconnect structure 111 between at least one of the traces 107 and the through via 108, as shown in FIG. 1C. In further embodiments, at least one of the traces 107 may be formed directly on top of the through via 108, as shown in FIG. 1D. In any of these embodiments, the conductive material 112 of the traces 107, the through via 108, and the optional interconnect structure 111 may be formed in one single processing stage. As a result, the portions of the conductive material 112 in these features may be generally homogeneous and without any physical boundaries between one another (dash lines are shown in FIGS. 1B-1D for virtual demarcation purposes only).

Figures 2A, 2B:
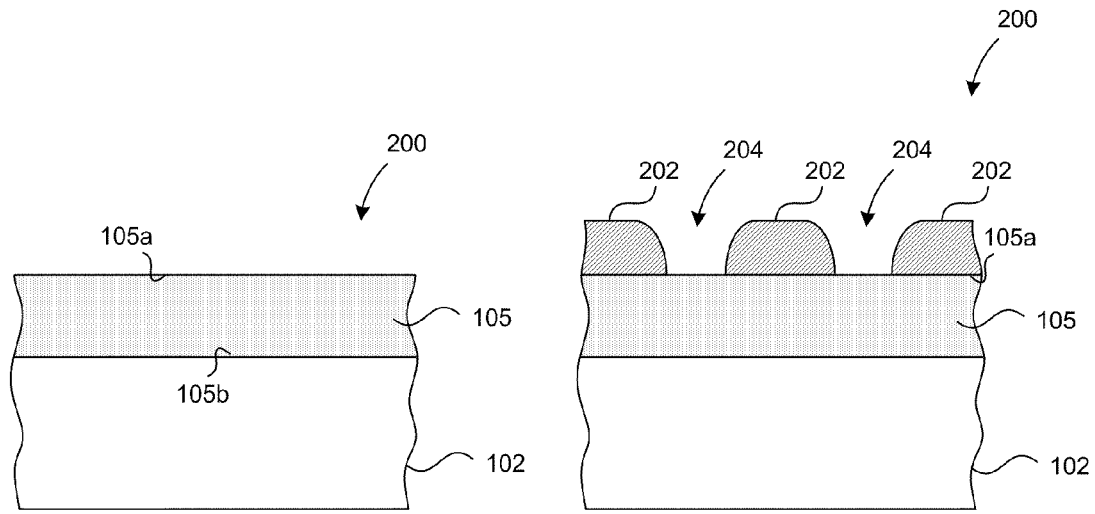
FIGS. 2A-2H are schematic side cross-sectional views of a portion of a semiconductor substrate undergoing a process useful for forming several embodiments of the semiconductor die 100 of FIG. 1A in accordance with embodiments of the technology.

FIGS. 2A-2H are schematic side cross-sectional views of a portion of a semiconductor substrate 200 undergoing a process useful for forming several embodiments of the semiconductor die 100 of FIG. 1A in accordance with embodiments of the technology. As shown in FIG. 2A, the process can include forming the dielectric 105 on top of the substrate 102. In certain embodiments, the dielectric 105 can be formed by depositing a dielectric material (e.g., silicon oxide) on the substrate 102 using chemical vapor deposition (CVD), atomic layer deposition (ALD), sputtering, and/or other suitable techniques. In other embodiments, the dielectric 105 can be formed by thermal oxidation of the substrate 102. Even though the dielectric 105 shown in FIG. 2A is one single homogeneous layer, in certain embodiments, the semiconductor substrate 200 can also include multiple layers (not shown) of dielectric material with a physical boundary therebetween. In further embodiments, the semiconductor substrate 200 may also include a passivation material (e.g., silicon nitride), a barrier material (e.g., tantalum), and/or other suitable structures formed on and/or in the dielectric 105.

As shown in FIG. 2B, a first photoresist material 202 is deposited on the dielectric 105 via spin coating or another suitable deposition technique. Subsequently, the first photoresist material 202 may be patterned to form first openings 204 in the first photoresist material 202. The first openings 204 can generally correspond to the pattern of the depressions 109 of FIGS. 1A-1C. The term "patterning" as used hereinafter generally refers to printing a desired pattern on a photoresist material and subsequently removing certain portions of the photoresist material to form the desired pattern in the photoresist material using photolithography and/or other suitable techniques.

Figures 2C, 2D:
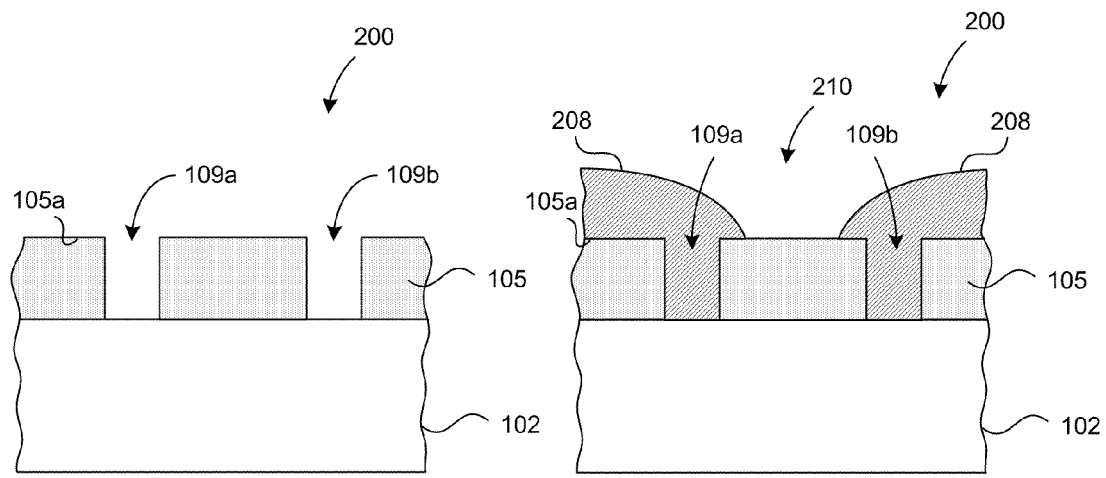

FIG. 2C illustrates a first material removal stage of the process, in which the exposed portion of the dielectric 105 is at least partially removed to form the depressions 109 (illustrated as a first depression 109a and a second depression 109b) before the first photoresist material 202 is removed. Techniques for removing the exposed portion of the dielectric 105 can include wet etching, dry etching, reactive ion etching, and/or other suitable techniques. In one embodiment, the removal of the dielectric 105 can stop when the first substrate surface 102a of the substrate 102 is exposed. In other embodiments, the removal of the dielectric 105 can stop at an intermediate depth (not shown) before reaching the first substrate surface 102a of the substrate 102 by adjusting a removal duration (e.g., an etching period during a wet etch process), a removal intensity (e.g., a plasma concentration during a plasma etching process), and/or other suitable material removal parameters. In certain embodiments, the first and second depressions 109a and 109b may have a depth from about 0.3 microns to about 0.5 microns. In other embodiments, the first and second depressions 109a and 109b may have other suitable depths.

As shown in FIG. 2D, after the depressions 109 are formed, the process can include at least partially covering the semiconductor substrate 200 with a second photoresist material 208. The process can also include subsequently patterning the second photoresist material 208 using photolithography and/or other suitable techniques to form a second opening 210 generally corresponding to the aperture 110 of the through via 108 (FIGS. 1A-1C). In certain embodiments, the second photoresist material 208 can have a composition that is generally similar to that of the first photoresist material 202. In other embodiments, the second photoresist material 208 can have compositions and/or characteristics that are different from that of the first photoresist material 202.

Figure 2E:
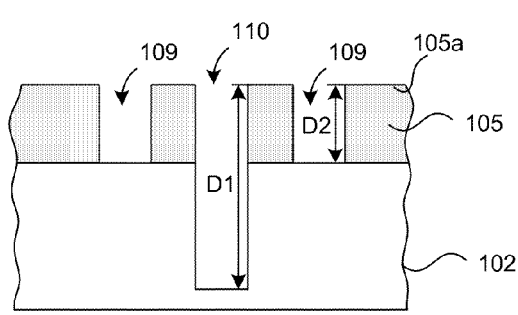

FIG. 2E illustrates a second material removal stage, in which a portion of the dielectric 105 and the substrate 102 exposed in the second opening 210 is removed to form the aperture 110 using anisotropic etching, reactive ion etching, and/or other suitable techniques. In certain embodiments, the aperture 110 can have an aspect ratio from about 5:1 to about 20:1 and can extend into the substrate 102 at a depth of about 50 microns to about 200 microns. In other embodiments, the aperture 110 can have an aspect ratio of about 10:1 and can extend into the substrate material at a depth of about 100 microns. Subsequently, the process can include removing the second photoresist material 208 from the semiconductor substrate 200. Optionally, the process can also include depositing a generally conformal insulating material (e.g., silicon oxide, not shown) in the aperture 110 before the second photoresist material 208 is removed. In other embodiments, the second material removal stage may include removing a portion of the dielectric 105 and the substrate 102 via laser drilling and/or other suitable drilling techniques without patterning the semiconductor substrate 200 with the second photoresist material 208, as discussed above with reference to FIG. 2D.

Figure 2F:
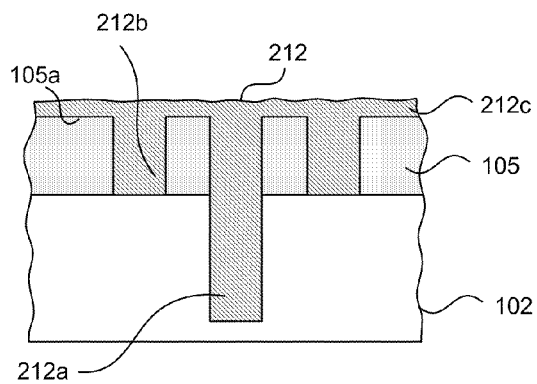

As shown in FIG. 2F, the process can include simultaneously filling the aperture 110 and the depressions 109 with a conductive material 212. The conductive material 212 includes a first portion 212a in the aperture 110, a second portion 212b in the depressions 109, and a third (or sacrificial) portion 212c extending beyond the first dielectric surface 105a of the dielectric 105. Suitable techniques for introducing the conductive material 212 into the aperture 110 and the depressions 109 can include pulsed chemical vapor deposition (pCVD), ionic physical vapor deposition (iPVD), atomic layer deposition (ALD), electro-grafting, bottom-up ECD plating, electroless plating, and/or other suitable techniques. The conductive material 212 can include copper, aluminum, tungsten, gold and/or alloys of the foregoing constituents. In particular embodiments, the conductive material 212 includes electrolytic copper introduced into the aperture 110 and/or the depressions 109 lined with a barrier material (e.g., tantalum). The electrolytic copper has an enhanced purity when compared to electrolessly disposed materials, and when compared to solder. For example, the conductive material can be at least 90% copper and in some cases, 99% copper.

Figure 2G:
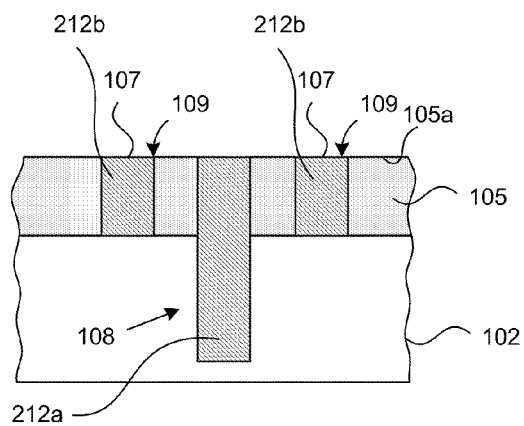

As shown in FIG. 2G, the third portion 212c of the conductive material 212 can be subsequently removed such that the first and second portions 212a and 212b of the conductive material 212 are generally flush with the first dielectric surface 105a. Techniques for removing the third portion 212c of the conductive material 212 can include chemical-mechanical polishing, electrochemical-mechanical polishing, and/or other suitable techniques.

Figure 2H:
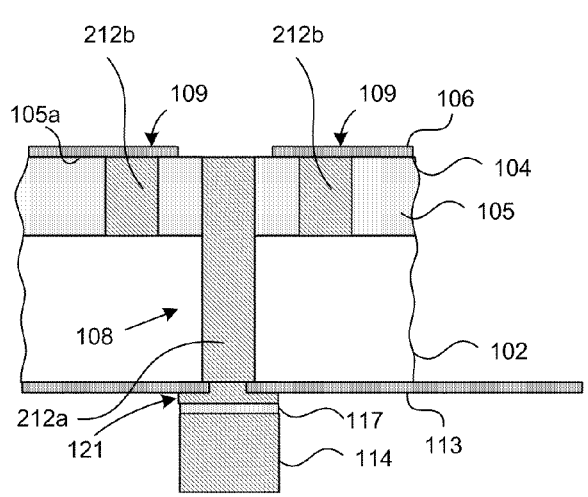

The process can also include subsequently processing the semiconductor substrate 200 to form additional features in and/or on the semiconductor substrate 200. For example, as shown in FIG. 2H, a portion of the substrate 102 can be removed from the second substrate surface 102b using a mechanical or chemical-mechanical technique to expose the second end 108b of the through via 108. An interconnect component 114 (e.g., a conductive pillar, a solder ball, a solder bump, a redistribution layer, a through silicon via stud, and/or other suitable interconnect devices) can then be attached to the second end 108b for interconnecting with an external component (not shown). The optional first and/or second passivation materials 106 and 113 can be deposited onto the dielectric 105 for insulating the traces 107 and the through via 108. In other examples, additional dielectric materials and/or conductive traces may be formed on top of the routing structure 104 and/or the optional first and second passivation materials 106 and 113.

Several embodiments of the process can be more efficient than conventional techniques by reducing several processing stages. Conventional techniques for forming through vias and traces in a semiconductor substrate typically include two conductive material deposition stages. In a first deposition stage, the through vias are initially formed, and in a second deposition stage, the traces are formed. By simultaneously depositing the conductive material 212 into both the depressions 109 and the aperture 110, only one deposition stage is required. As a result, the second deposition stage and any associated processing stages (e.g., polishing, cleaning, etc.) may be eliminated, thus improving the efficiency and cost-effectiveness of the fabrication process.

Several embodiments of the process can also reduce the risk of polishing defects (e.g., dishing) in the through via 108 and/or the traces 107. Typically, the exposed surface of the conductive material 212 in the through via 108 only occupies a small portion of the total surface area of the semiconductor substrate 200. If the traces 107 were not present, and the semiconductor substrate 200 was polished with only the conductive material 212 in the through via 108, the polishing pressure on the semiconductor substrate 200 would tend to be non-uniform over the entire surface area of the substrate. Such non-uniformity is believed to result in dishing, chipping, and/or other polishing defects. In contrast, in several embodiments of the process, the conductive material 212 occupies more of the total surface area of the semiconductor substrate 200 because the conductive material 212 is in both the through via 108 and in the traces 107. Without being bound by theory, it is believed that the increased surface area of the conductive material 212 can reduce the non-uniformity of the polishing pressure, and thus reducing the risk of polishing defects.

Figure 3A:
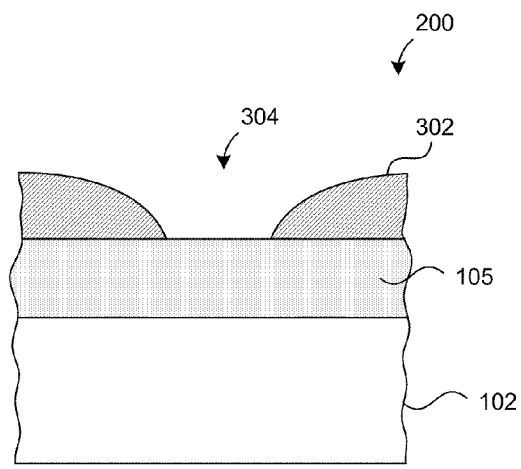
FIGS. 3A-3D are schematic side cross-sectional views of a portion of a semiconductor substrate undergoing a process useful for forming several embodiments of the semiconductor die 100 of FIG. 1A in accordance with additional embodiments of the technology.

Even though the foregoing process discussed with reference to FIGS. 2A-2H includes forming the depressions 109 before forming the aperture 110, FIGS. 3A-3D describe a process that includes forming the aperture 110 before forming the depressions 109. As shown in FIG. 3A, the process includes depositing a first photoresist material 302 onto the dielectric 105. The process can also include patterning the first photoresist material 302 to form a first opening 304 generally corresponding to the aperture 110 (FIGS. 1A-1C).

Figure 3B:
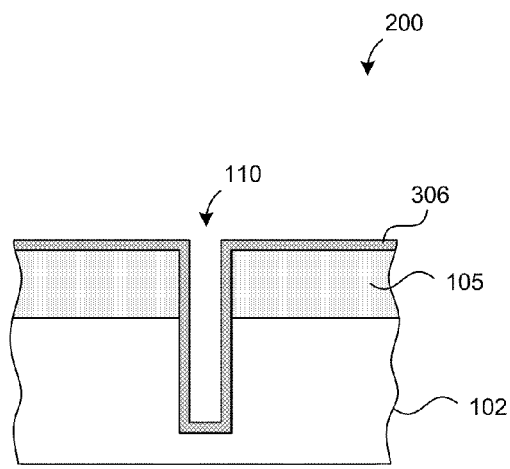

As shown in FIG. 3B, the process can include a first material removal stage, in which a portion of the dielectric 105 and the substrate 102 exposed in the first opening 304 is removed to form the aperture 110 using any of the suitable techniques discussed above. Subsequently, the process can include removing the first photoresist material 302 from the semiconductor substrate 200.

The process can also include depositing a layer of insulating material 306 in the aperture 110 and on the first dielectric surface 105a of the dielectric 105. The insulating material 306 can include silicon oxide, silicon nitride, and/or other suitable material. Suitable techniques for depositing the insulating material 306 can include, but are not limited to, chemical vapor deposition (CVD), physical vapor deposition (PVD), atomic layer deposition (ALD), thermo oxidation, and/or other suitable techniques.

Figure 3C:
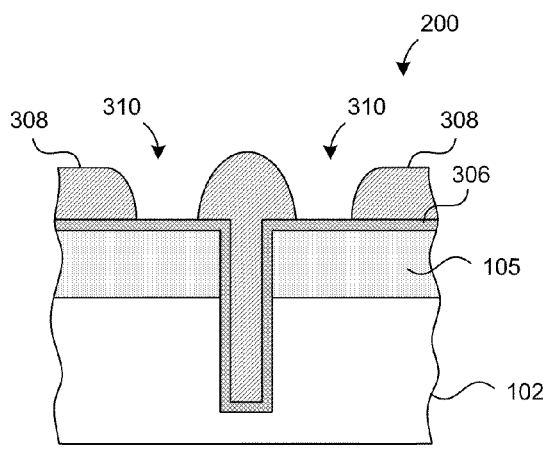

As shown in FIG. 3C, the process includes depositing a second photoresist material 308 onto the insulating material 306. The process can also include patterning the second photoresist material 308 to form second openings 310 generally corresponding to the depressions 109 (FIGS. 1A-1C).

Figure 3D:
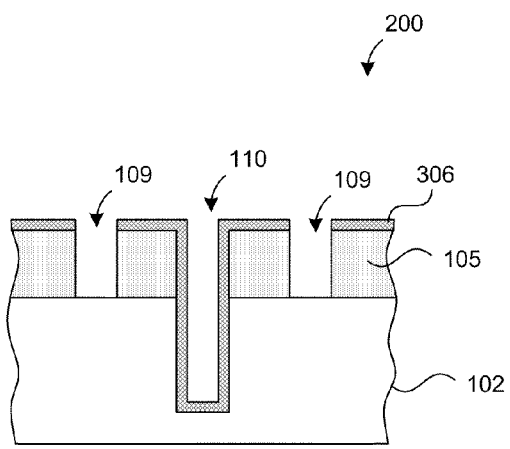

As shown in FIG. 3D, the process can include a second material removal stage, in which a portion of the insulating material 306 and the dielectric 105 generally corresponding to the second openings 310 is removed to form the depressions 109. Subsequently, the process can include removing the second photoresist material 308 from the semiconductor substrate 200. Then the process may include processing stages as discussed above with reference to FIGS. 2F-2H to form the semiconductor die 100 of FIGS. 1A-1C.

Several embodiments of the process can be more efficient in forming the insulating material 306 in the aperture 110 than conventional techniques. In accordance with conventional techniques, the depressions 109 may need to be shielded from the insulating material 306 with a fill material (if the depressions 109 are formed before forming the aperture 110) or a portion of the insulating material 306 external to the aperture 110 has to be removed via costly polishing (if the depressions 109 are formed after forming the aperture 110). In contrast, several embodiments of the process discussed above may eliminate such processing stages because the part of the insulating material 306 corresponding to the depressions 109 is simply removed during the second material removal stage.

The processing stages described above with reference to FIGS. 2A-3D are for illustration purposes. A person of ordinary skill in the art will recognize that certain processing stages are omitted for clarity. For example, in certain embodiments, before filling the depressions 109 and the aperture 110 with the conductive material 212, a barrier material, a seed material, and/or other suitable structures may be formed in the aperture 110 and/or the depressions 109. A person of ordinary skill in the art will also recognize that the foregoing processing stages may be modified for forming several embodiments of the semiconductor die 100' and 100" of FIGS. 1B and 1C, respectively. For example, the depressions 109 and the aperture 110 may be patterned as a single contiguous depression, as shown in FIG. 1B, or the interconnect structure 111 may be patterned with the depressions 109 and/or the aperture 110, as shown in FIG. 1C. In any of the foregoing embodiments, the process can further include at least one stage of cleaning, drying, cooling, annealing, and/or other suitable stages.

From the foregoing, it will be appreciated that specific embodiments of the technology have been described herein for purposes of illustration, but that various modifications may be made without deviating from the disclosure. For example, even though several embodiments of the processes are described above with reference to forming a semiconductor die, certain embodiments of the processes may also be applied to a semiconductor wafer in which a plurality of semiconductor dies may be formed. Many of the elements of one embodiment may be combined with other embodiments in addition to or in lieu of the elements of the other embodiments. For example, even though the depressions 109 and the aperture 110 of FIGS. 1A-3D are shown as formed in two material removal stages, in certain embodiments, these features may be patterned and formed in one single processing stage using phase shift masks and/or other suitable techniques. Accordingly, the disclosure is not limited except as by the appended claims.

We claim:

1. A method for processing a semiconductor substrate, comprising:
   forming an aperture in a semiconductor substrate and through a dielectric on the semiconductor substrate, the aperture having a first end open at the dielectric and a second closed end in the semiconductor substrate such that the aperture penetrates through at least a portion of a thickness of the semiconductor substrate, wherein a cross-sectional area of the aperture at the first end is generally the same as a cross-sectional area of the aperture at the second end;
   forming a plurality of depressions in the dielectric that are spaced apart from the aperture;
   simultaneously depositing a conductive material into the aperture and at least some of the plurality of depressions;
   forming a conductive interconnect structure to electrically couple the conductive material in the aperture to the conductive material in at least one of the plurality of depressions, wherein the conductive interconnect structure is positioned within the dielectric, and wherein the conductive interconnect structure is laterally positioned between the conductive material and a trace positioned within the dielectric;
   exposing the conductive material at the second end of the aperture; and
   attaching a solder ball to the exposed conductive material at the second end of the aperture.

2. The method of claim 1 wherein
   the semiconductor substrate has a first substrate surface and a second substrate surface;
   the dielectric has a first dielectric surface and a second dielectric surface in direct contact with the first substrate surface;
   forming the aperture includes forming an aperture open at the first dielectric surface and extends through the dielectric and into the semiconductor substrate, the aperture having a depth of at least 50 microns from the first dielectric surface and an aspect ratio of at least 5:1;
   forming the plurality of depressions includes forming a plurality of depressions that extend into the dielectric from the first dielectric surface, the plurality of depressions having a depth of about 0.3 to about 0.5 microns from the first dielectric surface;
   simultaneously depositing the conductive material includes depositing the conductive material into the aperture and in at least some of the plurality of depressions, the conductive material having a first portion in the aperture, a second portion in the depressions, and a third portion extending beyond the first dielectric surface; and
      the method further includes removing at least the third portion of the conductive material via chemical-mechanical polishing and/or electrochemical-mechanical polishing.

3. The method of claim 1 wherein
   the semiconductor substrate has a first substrate surface and a second substrate surface;
   the dielectric has a first dielectric surface and a second dielectric surface in direct contact with the first substrate surface;

forming the aperture includes forming an aperture open at the first dielectric surface and extends through the dielectric and into the semiconductor substrate, the aperture having a depth of at least 50 microns from the first dielectric surface and an aspect ratio of at least 5:1;

forming the plurality of depressions includes forming a plurality of depressions that extend into the dielectric from the first dielectric surface, the plurality of depressions having a depth of about 0.3 to about 0.5 microns from the first dielectric surface;

simultaneously depositing the conductive material includes plating copper into the aperture and in at least some of the plurality of depressions, the copper having a first portion in the aperture, a second portion in the depressions, and a third portion extending beyond the first dielectric surface; and the method further includes removing at least the third portion of the introduced copper via chemical-mechanical polishing and/or electrochemical-mechanical polishing.

4. The method of claim 1 wherein forming the aperture includes forming the aperture before forming the plurality of depressions.

5. The method of claim 1 wherein forming the aperture includes forming the aperture after forming the plurality of depressions.

6. The method of claim 1 wherein
the semiconductor substrate has a first substrate surface and a second substrate surface;
the dielectric has a first dielectric surface and a second dielectric surface in direct contact with the first substrate surface;
forming the plurality of depressions includes forming at least one depression open to the aperture;
simultaneously depositing the conductive material includes depositing the conductive material into the aperture and the at least one depression, the introduced conductive material having a first portion in the aperture and a second portion in the at least one depression; and
the first and second portions of the conductive material are generally homogeneous.

7. The method of claim 1 wherein
the semiconductor substrate has a first substrate surface and a second substrate surface;
the dielectric has a first dielectric surface and a second dielectric surface in direct contact with the first substrate surface;
forming the plurality of depressions includes forming at least one depression open to the aperture;
simultaneously depositing the conductive material includes depositing the conductive material into the aperture and the at least one depression, the introduced conductive material having a first portion in the aperture and a second portion in the at least one depression; and
the first and second portions of the conductive material are generally contiguous.

8. The method of claim 1 wherein
the semiconductor substrate has a first substrate surface and a second substrate surface;
the dielectric has a first dielectric surface and a second dielectric surface in direct contact with the first substrate surface;
forming the plurality of depressions includes forming at least one depression open to the aperture;

simultaneously depositing the conductive material includes depositing the conductive material into the aperture and the at least one depression, the introduced conductive material having a first portion in the aperture and a second portion in the at least one depression; and the first and second portions of the conductive material do not include a physical boundary between each other.

9. The method of claim 1 wherein
the semiconductor substrate has a first substrate surface and a second substrate surface;
the dielectric has a first dielectric surface and a second dielectric surface in direct contact with the first substrate surface;
the method further includes forming an interconnect structure open to at least one of the depressions and the aperture;
simultaneously depositing the conductive material includes depositing the conductive material into the aperture, at least some of the plurality of depressions, and the interconnect structure, the introduced conductive material having a first portion in the aperture, a second portion in the at least one depression, and a third portion in the interconnect structure; and
the first, second, and third portions of the conductive material do not include a physical boundary between one another.

10. The method of claim 1 wherein
the semiconductor substrate has a first substrate surface and a second substrate surface;
the dielectric has a first dielectric surface and a second dielectric surface in direct contact with the first substrate surface;
the method further includes forming an interconnect structure open to at least one of the depressions and the aperture;
simultaneously depositing the conductive material includes depositing the conductive material into the aperture, at least some of the plurality of depressions, and the interconnect structure, the introduced conductive material having a first portion in the aperture, a second portion in the at least one depression, and a third portion in the interconnect structure; and
the first, second, and third portions of the conductive material are contiguous.

11. The method of claim 1 wherein
the semiconductor substrate has a first substrate surface and a second substrate surface;
the dielectric has a first dielectric surface and a second dielectric surface in direct contact with the first substrate surface;
simultaneously depositing the conductive material includes depositing the conductive material into the aperture and at least some of the plurality of depressions, the introduced conductive material having a first portion in the aperture, a second portion in the depressions, and a third portion extending beyond the first dielectric surface; and
the method further includes:
polishing the semiconductor substrate; and
removing the third portion of the introduced conductive material until the first dielectric surface is exposed.

12. The method of claim 1 wherein
the semiconductor substrate has a first substrate surface and a second substrate surface;

the dielectric has a first dielectric surface and a second dielectric surface in direct contact with the first substrate surface;

simultaneously depositing the conductive material includes simultaneously depositing the conductive material into the aperture and at least some of the plurality of depressions, the introduced conductive material having a first portion in the aperture, a second portion in the depressions, and a third portion extending beyond the first dielectric surface; and the method further includes:
polishing the semiconductor substrate;
removing the third portion of the introduced conductive material until the first dielectric surface is exposed; and
reducing a risk of dishing the first portion of the conductive material in the aperture.

13. The method of claim 1 wherein:
the semiconductor substrate comprises a semiconductor material; and
forming the aperture includes forming an aperture extending into the semiconductor material, the second end of the aperture being at a depth in the semiconductor material.

14. The method of claim 1 wherein forming the conductive interconnect comprises simultaneously depositing the conductive material in the aperture and at least one of the depressions with conductive material for the conductive interconnect.

15. A method for processing a semiconductor wafer, the semiconductor wafer including a substrate with a first substrate surface and a second substrate surface, the semiconductor wafer also including a dielectric with a first dielectric surface and a second dielectric surface in direct contact with the first substrate surface, the method comprising:
forming an aperture having an open end at the first dielectric surface and a closed end in the substrate toward the second substrate surface such that the aperture penetrates through at least a portion of a thickness of the substrate, wherein a cross-sectional area of the aperture at the open end is generally the same as a cross-sectional area of the aperture at the closed end;
forming a plurality of depressions in the dielectric, the depressions extending between the first dielectric surface and the second dielectric surface and spaced apart from the aperture;
filling the depressions and at least a portion of the aperture with a conductive material in a single processing stage;
forming a conductive interconnect structure to electrically couple the conductive material in the aperture to the conductive material in at least one of the depressions, wherein the conductive interconnect structure is positioned within the dielectric, and wherein the conductive interconnect structure is laterally positioned between the conductive material and a trace positioned within the dielectric; and
removing material from the second substrate surface of the substrate and thereby exposing a portion of the conductive material proximate the closed end of the aperture.

16. The method of claim 15 wherein forming the aperture includes:
patterning the semiconductor wafer with a first photoresist material;
removing material from the patterned semiconductor wafer;
removing the first photoresist material; and
depositing an insulation material in the aperture and on the first dielectric surface of the dielectric.

17. The method of claim 15 wherein:
forming the aperture includes depositing an insulation material on the semiconductor wafer, the insulation material having a first portion in the aperture and a second portion on the first dielectric surface of the dielectric.

18. The method of claim 15 wherein forming the depressions includes forming at least one depression that extends into the dielectric from the first dielectric surface to a depth of about 0.3 to about 0.5 microns from the first dielectric surface.

19. The method of claim 15 wherein filling the depressions and the aperture with the conductive material includes plating the conductive material into the depressions and the aperture without intervening processing stages.

20. The method of claim 15 wherein:
filling the depressions and the aperture with the conductive material includes plating the conductive material into the depressions and the aperture without intervening processing stages, the conductive material including a portion extending beyond the first dielectric surface; and
removing the portion of the conductive material that extends beyond the first dielectric surface.

21. The method of claim 15, further comprising attaching a solder ball to the exposed conductive material proximate the closed end of the aperture.

22. The method of claim 15 wherein:
the semiconductor substrate comprises a semiconductor material; and
forming the aperture includes removing a portion of the semiconductor material from the semiconductor substrate such that the closed end of the aperture is at a depth in the semiconductor material.

* * * * *